United States Patent
Muranaka et al.

(10) Patent No.: US 8,067,779 B2
(45) Date of Patent: Nov. 29, 2011

(54) LIGHT EMITTING DEVICE WITH A RECESS LEAD PORTION

(75) Inventors: Tetsuya Muranaka, Fukuoka-ken (JP); Masaki Adachi, Fukuoka-ken (JP); Iwao Matsumoto, Fukuoka-ken (JP); Kenji Naito, Hyogo-ken (JP); Toshiaki Hosoya, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 139 days.

(21) Appl. No.: 12/652,422

(22) Filed: Jan. 5, 2010

(65) Prior Publication Data
US 2010/0171139 A1 Jul. 8, 2010

(30) Foreign Application Priority Data
Jan. 7, 2009 (JP) .................................. 2009-001491

(51) Int. Cl.
*H01L 33/00* (2010.01)
*H01R 9/00* (2006.01)

(52) U.S. Cl. ............ 257/98; 257/99; 257/432; 257/433; 257/672; 257/674; 257/E33.067; 257/E33.076; 361/773; 361/813

(58) Field of Classification Search ........................ None
See application file for complete search history.

(56) References Cited

U.S. PATENT DOCUMENTS

| | | | | |
|---|---|---|---|---|
| 3,914,786 A * | 10/1975 | Grossi | ............................. | 257/98 |
| 6,091,084 A * | 7/2000 | Fujii | ............................... | 257/82 |
| 7,291,866 B2 | 11/2007 | Oshio et al. | | |
| 7,499,288 B2 * | 3/2009 | Tanaka et al. | ................. | 361/767 |
| 7,531,845 B2 | 5/2009 | Oshio et al. | | |
| 7,557,384 B2 | 7/2009 | Matsumoto et al. | | |
| 2005/0280017 A1* | 12/2005 | Oshio et al. | ...................... | 257/99 |
| 2010/0102349 A1* | 4/2010 | Hata | ............................... | 257/98 |

FOREIGN PATENT DOCUMENTS

JP          06140550          5/1994

* cited by examiner

*Primary Examiner* — Alonzo Chambliss
(74) *Attorney, Agent, or Firm* — Turocy & Watson, LLP

(57) ABSTRACT

A light emitting device includes: a light emitting element; a first lead including a recess in one end portion, the recess including a first bottom surface with the light emitting element bonded thereto, at least one of a through hole and a notch, and a light shielding portion capable of suppressing leakage of emitted light from the light emitting element from the one of the through hole and the notch; a second lead opposed to the first lead; and a molded body filling the one of the through hole and the notch, covering the light emitting element, embedding at least part of the first lead and at least part of the second lead, and made of a translucent resin.

17 Claims, 14 Drawing Sheets

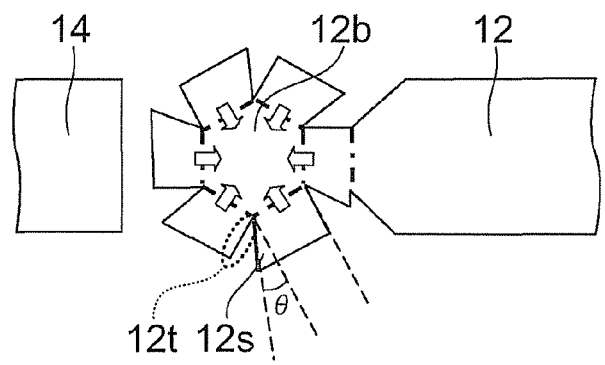
FIG. 7A
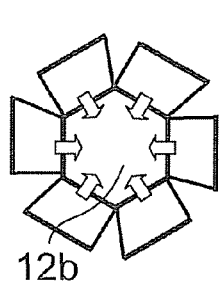
FIG. 7B
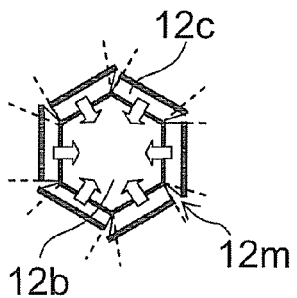
FIG. 7C
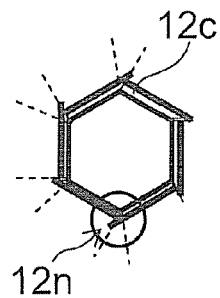
FIG. 7D
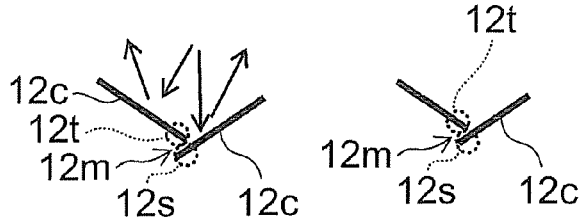
FIG. 7E
FIG. 7F
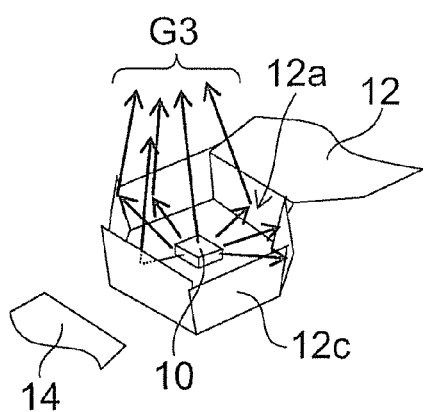
FIG. 7G

LIGHT EMITTING DEVICE WITH A RECESS LEAD PORTION

CROSS-REFERENCE TO RELATED APPLICATIONS

This application is based upon and claims the benefit of priority from the prior Japanese Patent Application No.2009-001491, filed on Jan. 7, 2009; the entire contents of which are incorporated herein by reference.

BACKGROUND OF THE INVENTION

1. Field of the Invention

This invention relates to a light emitting device.

2. Background Art

Light emitting devices intended for lighting apparatuses including vehicle-mounted interior and exterior lamps and traffic signals are required to have higher brightness and higher light flux. In a light emitting device having a structure in which a light emitting element is bonded to the bottom surface of a recess provided in the lead, light emitted laterally from the light emitting element can be reflected upward by the beveled inner sidewall of the recess, which facilitates increasing its optical output.

Furthermore, the recess of the lead with the light emitting element bonded thereto is sealed with resin, such as silicone, to protect the inside. Silicone or other resin typically has a larger thermal expansion coefficient than the metal lead and the light emitting element.

When the light emitting device is mounted on a substrate, stress occurs at temperature rise and fall in the solder dip process and solder reflow process due to the difference in thermal expansion coefficient. For instance, in the cooling process, stress occurring due to contraction of the resin having large thermal expansion coefficient is applied to leads, chips, bonding wires and the like. This may cause peeling of the resin at the interface therewith, which may lead to degradation in optical and electrical characteristics and device failure.

JP-A-6-140550 (Kokai)(1994) discloses an example technique for avoiding cracks in a resin sealed package. In this example technique, cut-raised parts are formed in a tab. The resulting cut-out holes and cut-raised pieces are enclosed in a sealing resin, and their anchoring effect serves to avoid cracks.

However, application of this structure to a light emitting device makes it difficult to effectively extract light passing through the cut-out holes and interferes with increasing the brightness and light flux.

SUMMARY OF THE INVENTION

According to an aspect of the invention, there is provided a light emitting device including: a light emitting element; a first lead including a recess in one end portion, the recess including a first bottom surface with the light emitting element bonded thereto, at least one of a through hole and a notch, and a light shielding portion capable of suppressing leakage of emitted light from the light emitting element from the one of the through hole and the notch; a second lead opposed to the first lead; and a molded body filling the one of the through hole and the notch, covering the light emitting element, embedding at least part of the first lead and at least part of the second lead, and made of a translucent resin.

According to another aspect of the invention, there is provided a light emitting device including: a light emitting element; a first lead including a recess, and first and second bent portions bent to a light extraction side of the recess, the recess including a bottom surface with the light emitting element bonded thereto and a sidewall capable of partly reflecting emitted light from the light emitting element upward; a second lead opposed to the first lead; and a molded body filling between the first and second bent portions, covering the light emitting element, embedding at least part of the first lead and at least part of the second lead, and made of a translucent resin, the first and second bent portion being capable of partly reflecting the emitted light upward.

According to another aspect of the invention, there is provided a light emitting device including: a light emitting element; a first lead with the light emitting element bonded thereto, the first lead including a first and second bent portions bent so that emitted light from the light emitting element can be reflected upward; a second lead opposed to the first lead; and a molded body filling between the first and second bent portions, covering the light emitting element, embedding at least part of the first lead and at least part of the second lead, and made of a translucent resin.

BRIEF DESCRIPTION OF THE DRAWINGS

FIGS. 7A to 7G are schematic views of a light emitting device according to a fifth embodiment;

DETAILED DESCRIPTION OF THE INVENTION

Embodiments of the invention will now be described with reference to the drawings.

Figure 1A:
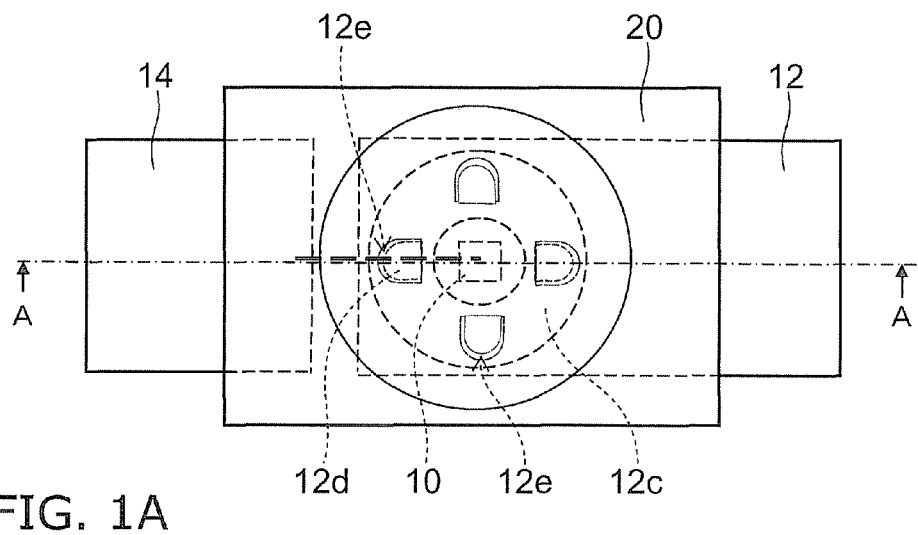
FIGS. 1A to 1C are schematic views of a light emitting device according to a first embodiment.
Figure 1B:
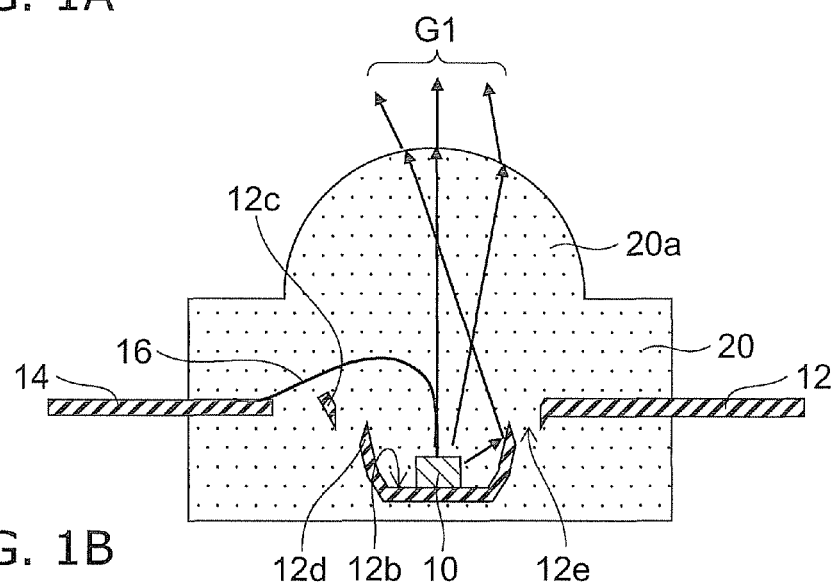
Figure 1C:
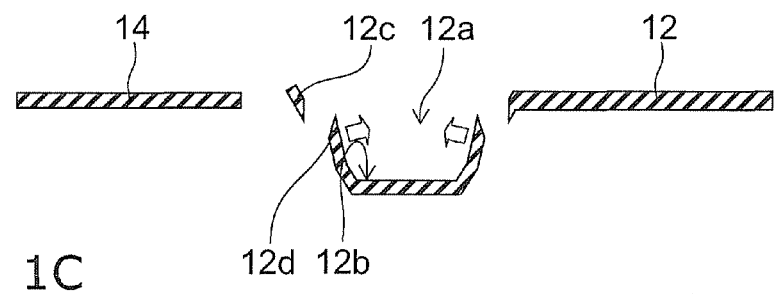

FIG. 1A is a schematic plan view of a light emitting device according to a first embodiment of the invention, FIG. 1B is a schematic cross-sectional view thereof taken along line A-A, and FIG. 1C is a schematic cross-sectional view of leads taken along line A-A.

As shown in FIG. 1C, a first lead 12 has a cup-shaped recess 12a. The bottom surface of the recess 12a serves as a mounting bed 12b on which a light emitting element 10 is mounted (bonded) illustratively using silver paste or metal solder. Furthermore, an incision is provided in a U-shaped prescribed region of the sidewall 12c of the recess 12a and bent toward the light emitting element 10 as indicated by the block arrow to form a bent portion 12d. More specifically, a prescribed region of the first lead 12 is bent toward the light emitting element 10 to form a bent portion 12d.

The space left behind the bent portion 12d constitutes a through hole 12e. The inner surface of this bent portion 12d is configured so that emitted light from the light emitting element 10 can be reflected upward and suppressed not to leak laterally or downward from the through hole 12e. More specifically, the bent portion 12d functions as a light shielding portion for suppressing leakage of the light from the through hole 12e. Furthermore, the inner surface of the sidewall 12c with no bent portion 12d can also reflect the emitted light upward.

A second lead 14 has one end portion opposed to one end portion of the first lead 12 where the recess 12a is provided. The one end portion of the second lead 14 is connected to the upper surface electrode (not shown) of the light emitting element 10 by a bonding wire 16.

The light emitting layer of the light emitting element 10 can be formed on a GaP, GaAs or other substrate and illustratively made of $In_x(Ga_yAl_{1-y})_{1-x}P$ (where $0 \leq x \leq 1$, $0 \leq y \leq 1$) capable of emitting green to red light, or $In_x(Ga_yAl_{1-y})_{1-x}N$ ($0 \leq x \leq 1$, $0 \leq y \leq 1$) capable of emitting blue light. With regard to size, a high-power light emitting element 10 can be illustratively shaped like a square of 1 mm×1 mm with a thickness of 0.1 to 0.3 mm.

The first lead 12 and the second lead 14 are linked in a plurality like a lead frame. The lead frame is illustratively made of a copper-based metal or an iron-based alloy with a thickness of 0.15 to 0.3 mm. Preferably, coating is applied to the inner surface of the sidewall 12c, the bent portion 12d, and the first bottom surface 12b of the recess 12a to increase reflectance. The coating can be illustratively made of Ag, or Ni/Pd/Au laminated in this order. The thickness of the coating made of Ag can be e.g. approximately 10 µm. For the laminated coating, Ni can be approximately 1 µm, Pd can be approximately 0.03 µm, and Au can be approximately 0.01 µm.

The other end portion of the first lead 12 and the other end portion of the second lead 14 are configured to protrude in directions opposite to each other from a molded body 20 made of transparent resin such as silicone and epoxy. The transparent resin has a refractive index of generally 1.4, and the upper portion of the molded body 20 is formed into a lens portion 20a. This facilitates converging emitted light G1 near the optical axis as shown in FIG. 1B, thereby increasing the light intensity near the optical axis to achieve high brightness and high light flux. The lens portion 20a can be formed by transfer molding. Here, the light reflected upward by the inner surface of the bent portion 12d may be emitted in a direction crossing the optical axis. In this case, the bending angle of the bent portion 12d can be adapted to the intended specification to appropriately control the emitting direction.

The light emitting device like this is often fixed to a circuit board with solder by the reflow process and the like. Here, if AgSn-based or other lead-free solder is used for the purpose of safeguarding the environment, the light emitting device undergoes a thermal history including temperature rise to at least approximately 260° C., wait for wetting with solder (e.g. 5 to 10 seconds), and rapid cooling to room temperature.

In this case, thermal stress occurs at the time of rapid cooling. More specifically, the thermal expansion coefficient of the transparent resin such as silicone and epoxy is larger than any of the thermal expansion coefficient of the first and second leads 12, 14 made of metal and the thermal expansion coefficient of the light emitting element 10. Hence, at the time of rapid cooling, a contraction stress is applied to the first and second leads 12, 14 and the light emitting element 10. If the tolerable limit for this contraction stress is exceeded, peeling may occur at the interface between the lead and the molded body 20 or at the interface between the light emitting element 10 and the molded body 20. This is not limited to the mounting process. For instance, depending on the operating environment, thermal stress due to the repeated cycle of turning on/off the light emitting element 10 may also cause peeling.

In this embodiment, the through hole 12e formed in the prescribed region of the recess 12a (the region left behind the bent portion 12d) penetrates through the first lead 12 and can suppress loosening between the first lead 12 and the molded body 20 illustratively made of transparent resin. Furthermore, because the molded body 20 fills in the through hole 12e, the bite between the first lead 12 and the molded body 20 can be improved. Thus, the adhesion strength between the first lead 12 and the molded body 20 can be increased, and peeling therebetween can be prevented. That is, the through hole 12e has an anchoring effect.

Furthermore, the bent portion 12d is embedded in the molded body 20, which facilitates further improving the bite and further increasing the adhesion strength. The through hole 12e and the bent portion 12d are provided in the recess 12a of the first lead 12, which facilitates increasing adhesion strength between the first lead 12 and the molded body 20 made of transparent resin, particularly near the light emitting element 10. Thus, peeling between the light emitting element 10 and the molded body 20 can be avoided.

Peeling, if any, at the interface between the light emitting element 10 and the molded body 20 changes the radiation pattern of emitted light. However, this embodiment can readily suppress such degradation in optical characteristics. Furthermore, peeling at the interface between the first lead 12 or the second lead 14 and the molded body 20 may cause a break in the bonding wire 16 and lead to degradation in electrical characteristics. However, this embodiment can suppress such degradation.

Furthermore, although not resulting in peeling, thermal stress may cause cracks. Cracks may cause degradation in the characteristics of the light emitting element 10 due to moisture absorption through the cracks. However, this embodiment can suppress such degradation and provide a light emitting device with improved reliability.

Figure 2A:
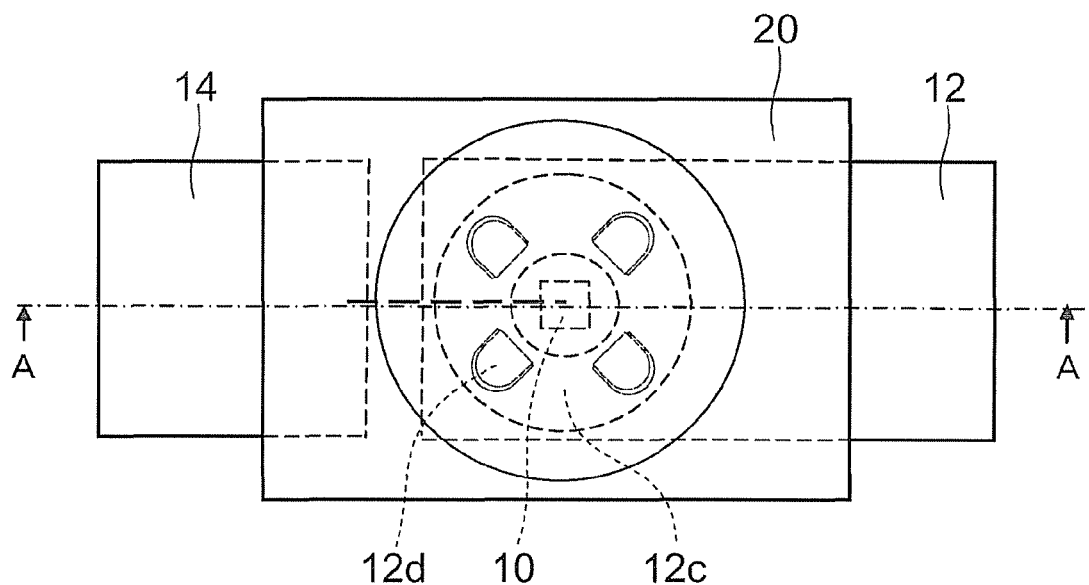
FIGS. 2A and 2B are schematic views of a light emitting device according to a variation.
Figure 2B:
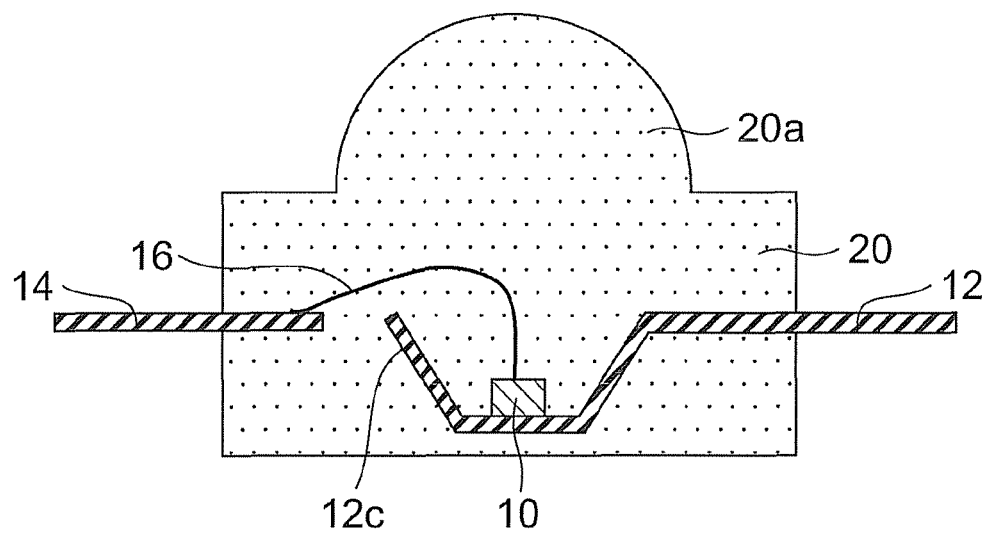

FIG. 2A is a schematic plan view of a light emitting device according to a variation of the first embodiment, and FIG. 2B is a schematic cross-sectional view thereof taken along line A-A.

In this variation, as viewed from above, the bonding wire 16 and the bent portion 12d do not cross each other. This can prevent the bent portion 12d from being in contact with the bonding wire 16 even if the bent portion 12d is bent toward the light emitting element 10, and thus the bent portion 12d can be made higher. Furthermore, the bent portion 12d is located near the extension of the chip diagonal, where emitted light intensity is relatively low. This facilitates reducing light leaking from the through hole.

Figure 3A:
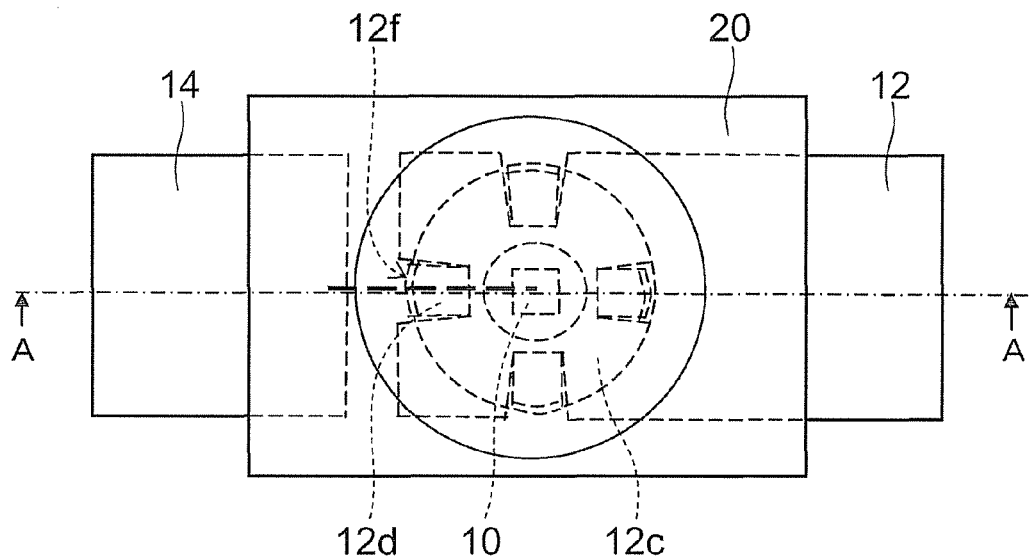
FIGS. 3A and 3B are schematic views of a light emitting device according to a second embodiment.
Figure 3B:
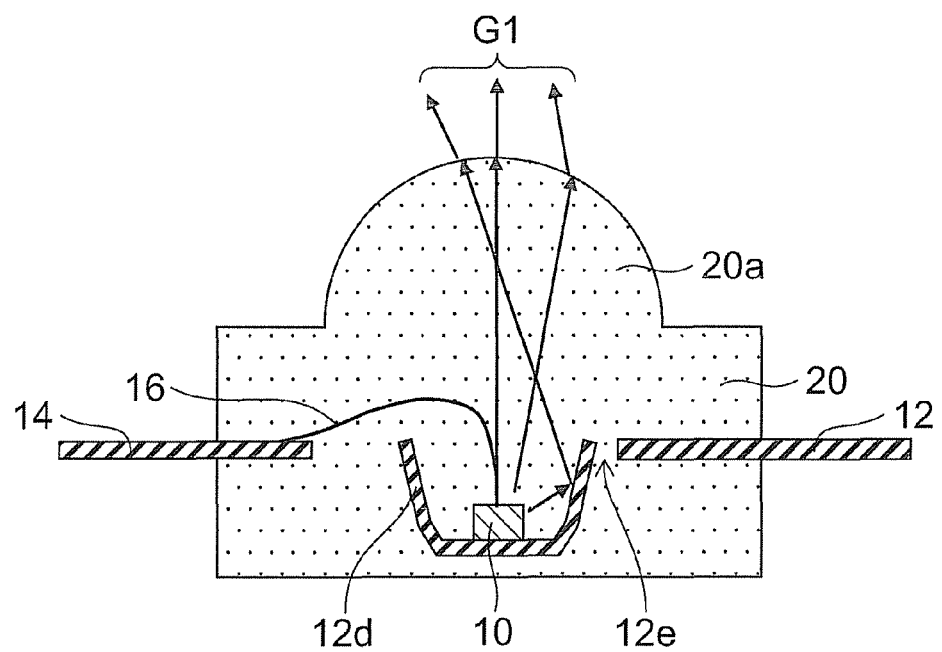

FIG. 3A is a schematic plan view of a light emitting device according to a second embodiment, and FIG. 3B is a schematic cross-sectional view thereof taken along line A-A.

In this embodiment, the incision is not U-shaped but shaped like a straight line. Thus, the first lead 12 has a notch 12f as viewed from above in the space left behind the bent portion 12d. The notch 12f and the bent portion 12d can improve the bite between the first lead 12 and the molded body made of transparent resin and increase the adhesion strength. Furthermore, because the molded body 20 fills in the notch, loosening can be suppressed, which contributes to improvement in adhesion strength.

On the side of the first lead 12 protruding from the molded body 20, it is possible to provide a through hole 12e rather than a notch. However, the through hole may be omitted. The notch can be shaped like a curve. This facilitates determining the shape of the bent portion 12d more freely, and also facilitates bending.

Figure 4A:
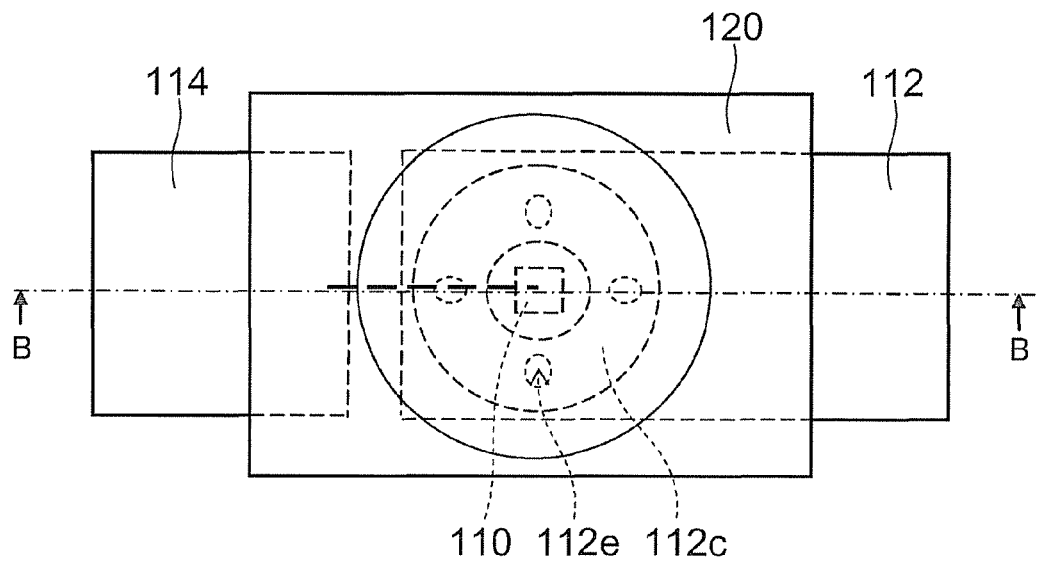
FIGS. 4A and 4B are schematic views of a light emitting device according to a comparative example.
Figure 4B:
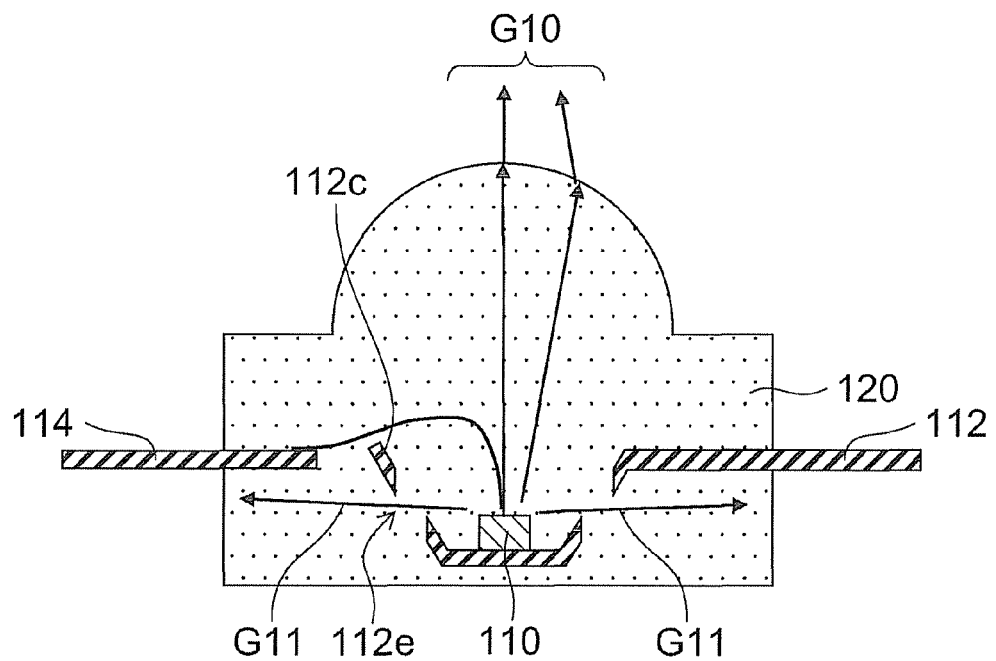

FIG. 4A is a schematic plan view of a light emitting device according to a comparative example, and FIG. 4B is a schematic cross-sectional view thereof taken along line B-B.

A through hole 112e vertically penetrates through a sidewall 112c of a recess 112a, and a molded body 120 fills the through hole 112e. In this comparative example, part of the lateral component, G11, of emitted light from a light emitting element 110 leaks outside from the through hole 112e, decreasing the light extraction efficiency. Here, if the through hole 112e is reduced to increase the light extraction efficiency, the anchoring effect decreases.

In contrast, in this embodiment, the inner surface of the bent portion 12d can reflect light upward, functioning as a light shielding portion capable of suppressing external leakage of light. This facilitates maintaining high optical output, brightness, and light flux of the emitted light G1.

Figure 5A:
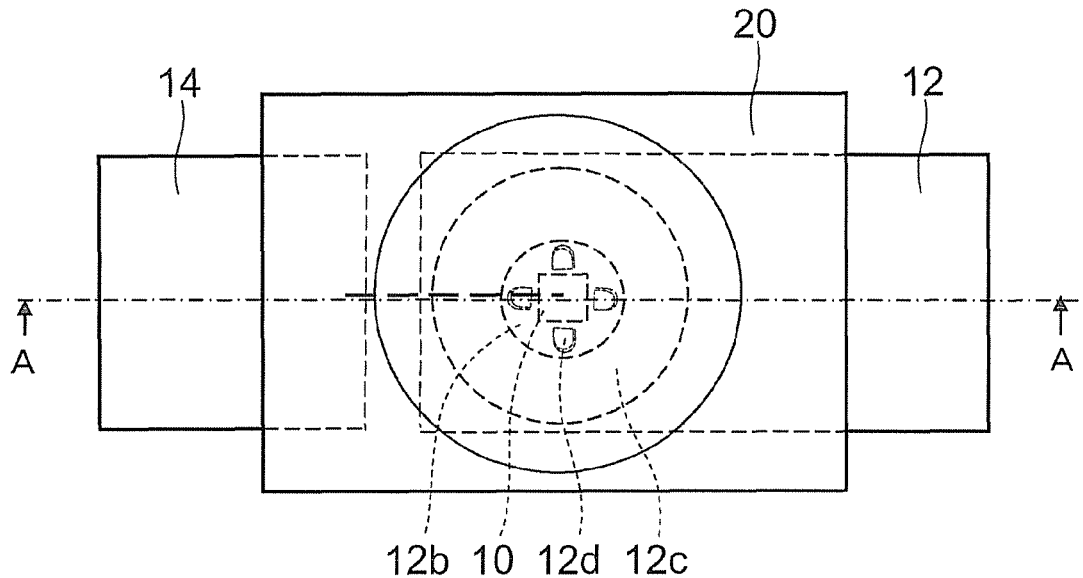
FIGS. 5A and 5B are schematic views of a light emitting device according to a third embodiment.
Figure 5B:
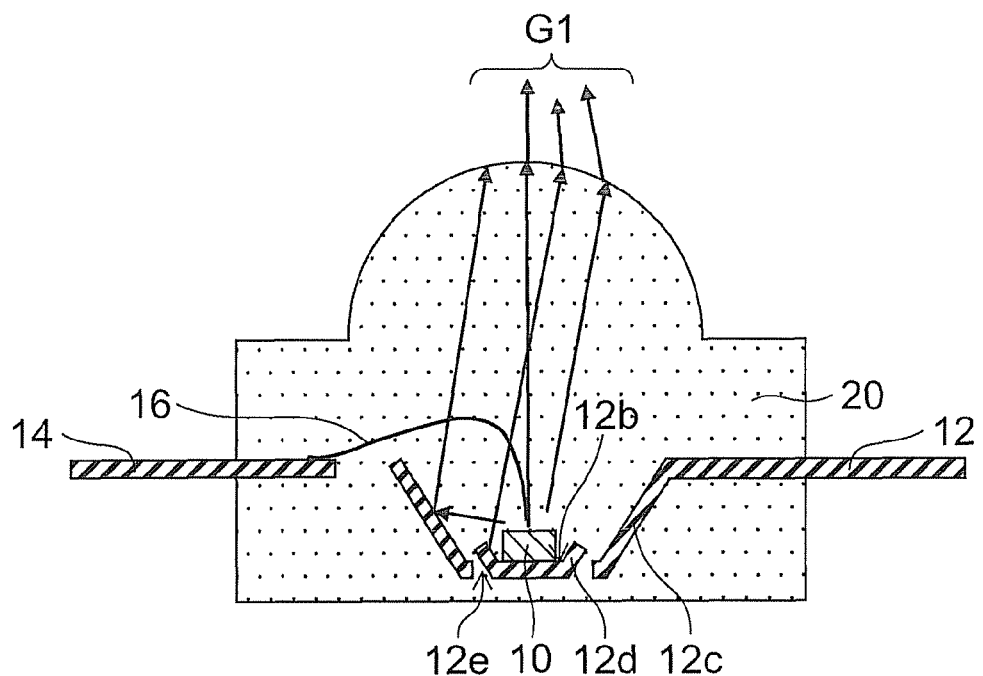

FIG. 5A is a schematic plan view of a light emitting device according to a third embodiment, and FIG. 5B is a schematic cross-sectional view thereof taken along line A-A.

In this embodiment, the bent portion 12d is provided in a mount bed 12b with the light emitting element 10 mounted thereon. In FIG. 5A, the bent portion 12d is provided so as to surround the four side surfaces of the light emitting element 10. If the mount bed 12b is enlarged, the bent portion 12d can be enlarged, or increased in number, for instance. This facilitates increasing upward reflection and achieving higher optical output.

Emitted light from the light emitting element 10 is difficult to emit downward from the through hole 12e provided in the mount bed 12b, and hence high optical output can be maintained. Furthermore, because the molded body 20 fills in the through hole 12e and enclosingly embeds the bent portion 12d, loosening from the first lead 12 is suppressed and the biter is improved. This increases the adhesion strength particularly near the light emitting element 10, and can prevent peeling between the molded body 20 and the first lead 12.

Figure 6A:
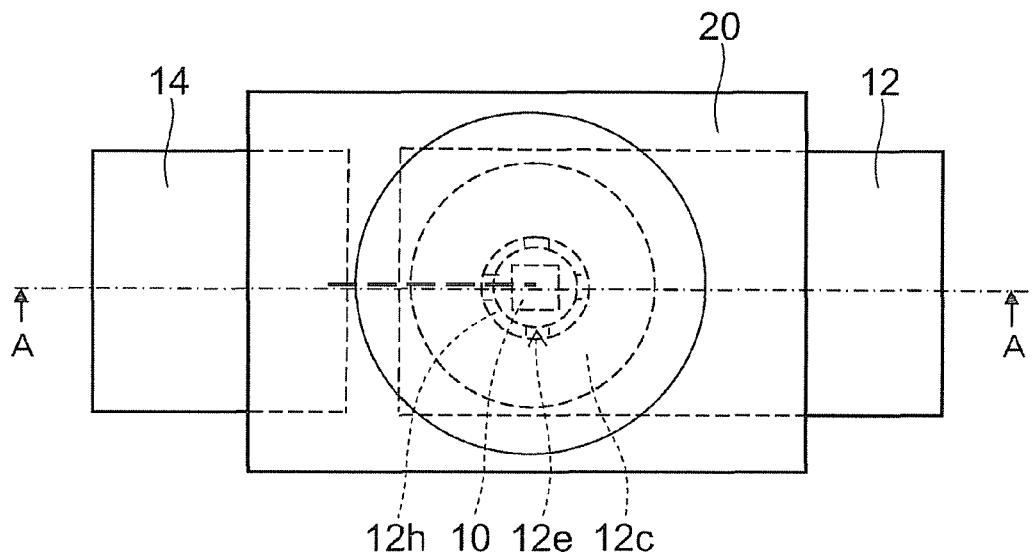
FIGS. 6A and 6B are schematic views of a light emitting device according to a fourth embodiment.
Figure 6B:
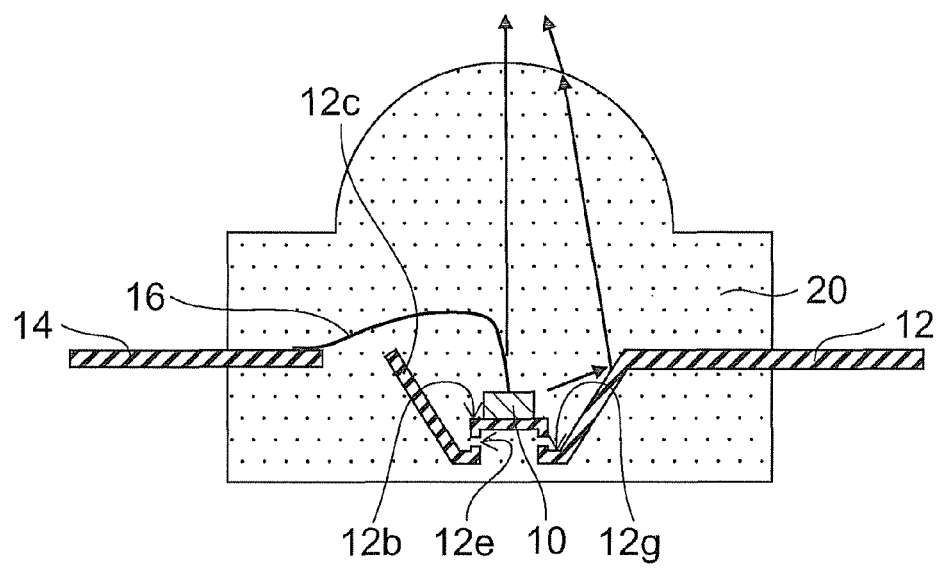

FIG. 6A is a schematic plan view of a light emitting device according to a fourth embodiment, and FIG. 6B is a schematic cross-sectional view thereof taken along line A-A.

In this embodiment, the bottom surface of the recess 12a has a double bottom structure. More specifically, the recess 12a of the first lead 12 has a mount bed (first bottom surface) 12b and a second bottom surface 12g which is deeper than the mount bed 12b. The light emitting element 10 is bonded to the mount bed 12b illustratively using silver paste or metal solder.

The mount bed 12b is coupled by a lower sidewall 12h provided upright on the second bottom surface 12g. The lower sidewall 12h has a through hole 12e, which is filled with the molded body 20 made of transparent resin so as to penetrate therethrough. Thus, the first lead 12 and the molded body 20 are securely engaged with each other, increasing the adhesion strength. Emitted light is less likely to leak outside from the through hole 12e provided in the lower sidewall 12h.

More specifically, the lower sidewall 12h provided below the first bottom surface 12b and including the through hole 12e functions as a light shielding portion. Hence, upward optical output can be readily kept high. Such a double bottom can be formed by press working of a lead frame using a die. The through hole 12e provided in the lower sidewall 12h can suppress loosening between the molded body 20 and the lead 12, and improve the bite, which facilitates increasing the adhesion strength.

FIG. 7A is a developed view of the lead of a light emitting device according to a fifth embodiment, FIGS. 7B, 7C, and 7D are schematic plan views showing the bending process, FIG. 7E is a schematic plan view showing the light shielding effect, FIG. 7F is a schematic plan view showing a notch, and FIG. 7G is a schematic perspective view. In FIG. 7, the mount bed 12b is shaped like a hexagon as viewed from above, but it may be any polygon other than a hexagon.

In FIG. 7A, incised portions are bent from the mount bed 12b (FIGS. 7B and 7C). By bending, as shown in FIG. 7D, sidewalls 12c constituting the recess 12a are formed. Here, as shown in FIG. 7A, if a first edge 12s of the sidewall 12c is provided with a tilt of angle θ, emitted light from the light emitting element 10 can be suppressed not to leak outside from a notch 12m in the sidewall 12c of the recess 12a after the bending.

More specifically, as shown in FIG. 7E, the first edge 12s encircled by a dotted line and a second edge 12t encircled by a dotted line overlap each other as viewed from the light emitting element 10 and function as a light shielding portion. Thus, emitted light can be suppressed not to leak outside from the notch 12m provided in the sidewall 12c.

On the other hand, as shown in FIG. 7F, the notch 12m between the first edge 12s and the second edge 12t can improve the bite between the molded body 20 made of transparent resin and the first lead 12 and suppress loosening therebetween, which increases the adhesion strength. This prevents peeling between the molded body 20 and the first lead 12.

Thus, light from the light emitting element 10 is reflected upward by the inner surface of the sidewall 12c of the recess 12a, which facilitates increasing the optical output, brightness, and light flux of emitted light G3.

Figure 8A:
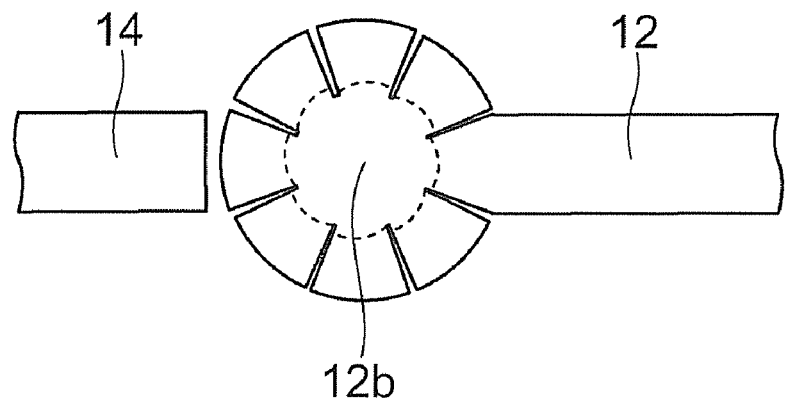
FIGS. 8A and 8B are developed views of the recess according to a variation.
Figure 8B:
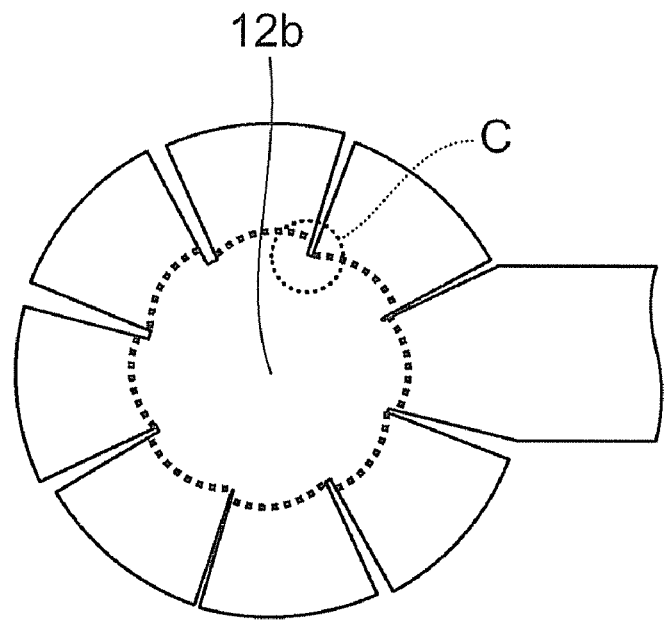

FIG. 8A is a developed view of a lead illustrating a variation of the fifth embodiment, and FIG. 8B is a developed view of the recess.

The recess 12a is not limited to a polygonal recess. As shown in FIG. 8, it is also possible to incise and bend a circular region of the first lead 12. In this case, as in region C indicated by a dashed line in FIG. 8B, if the fold is shifted from the circumference, an overlapping region can be formed at the edge of the sidewall, and a notch can be provided. The overlapping region functions as a light shielding portion capable of suppressing leakage of light from the notch, and the optical output can be increased. Furthermore, the notch can improve the bite and suppress the loosening. This can increase the adhesion strength and prevent peeling between the molded body and the lead.

Figure 9:
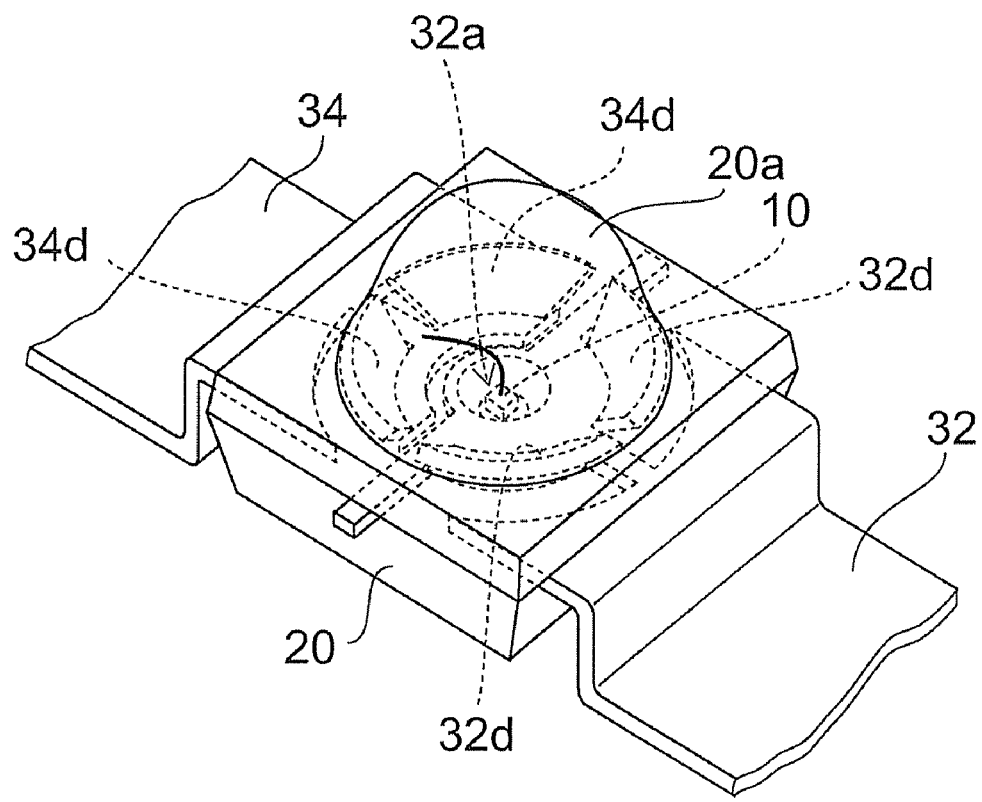
FIG. 9 is a schematic perspective view of a light emitting device according to a sixth embodiment.

FIG. 9 is a schematic perspective view of a light emitting device according to a sixth embodiment.

A recess 32a is provided in one end portion of a first lead 32. This one end portion is opposed to a second lead 34. The first lead 32 has at least two fan-shaped bent portions 32d bent toward the light extraction side of the recess 32a. In this figure, an outer lead extends from between the two bent portions 32d. Here, the shape of the first lead 32 is not limited to that shown in FIG. 9. For instance, portions adjacent to the bend portion 32d may serve as an outer lead. Furthermore, a light emitting element 10 is bonded to the bottom surface of the recess 32a.

The second lead 34 also has two fan-shaped bent portions 34d.

Furthermore, a molded body 20 made of translucent resin is molded so as to cover the light emitting element 10, fill between the bent portions 32d, 34d, and embed part of the first lead 32 and the second lead 34.

Emitted light from the light emitting element 10 bonded to the bottom surface of the recess 32a is reflected upward by the inner wall of the recess 32a, the bent portion 32d of the first lead 32, and the bent portion 34d of the second lead 34. This can reduce leakage of light and achieve high brightness. Furthermore, the upper portion of the molded body 20 can be formed into a dome-shaped lens portion 20a to increase the brightness. Because the translucent resin fills between the bent portions 32d, 34d, the adhesion strength between the first and second leads 32, 34 and the molded body 20 can be increased. That is, the anchoring effect can be increased.

Figure 10A:
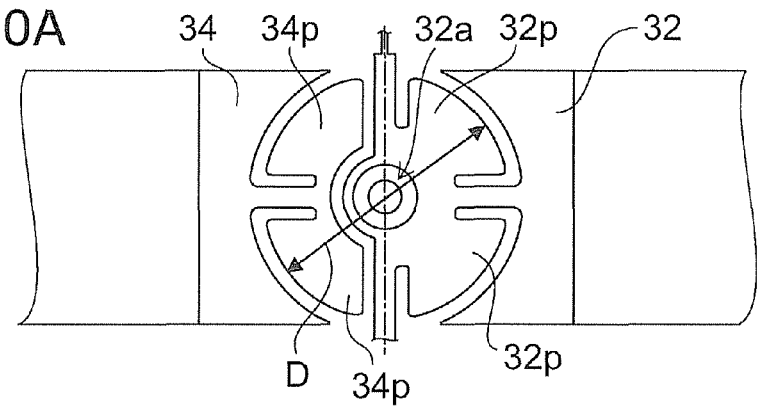
FIGS. 10A to 10D are views illustrating a bent portion.
Figure 10B:
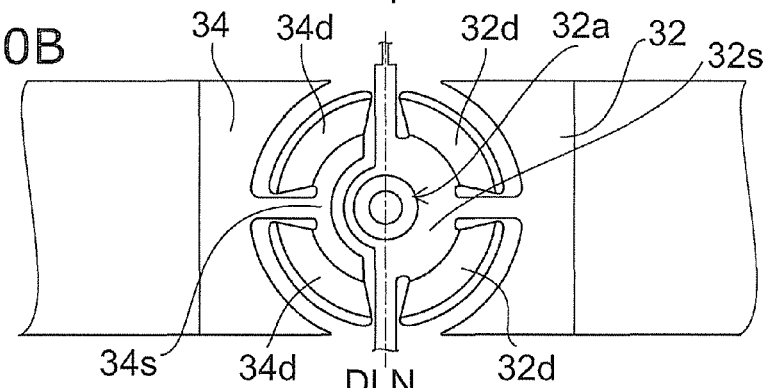
Figure 10C:
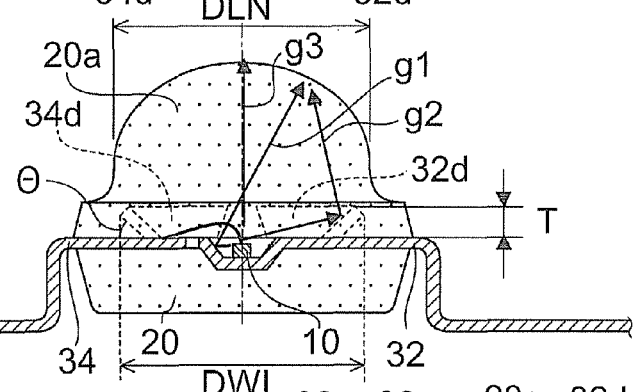
Figure 10D:
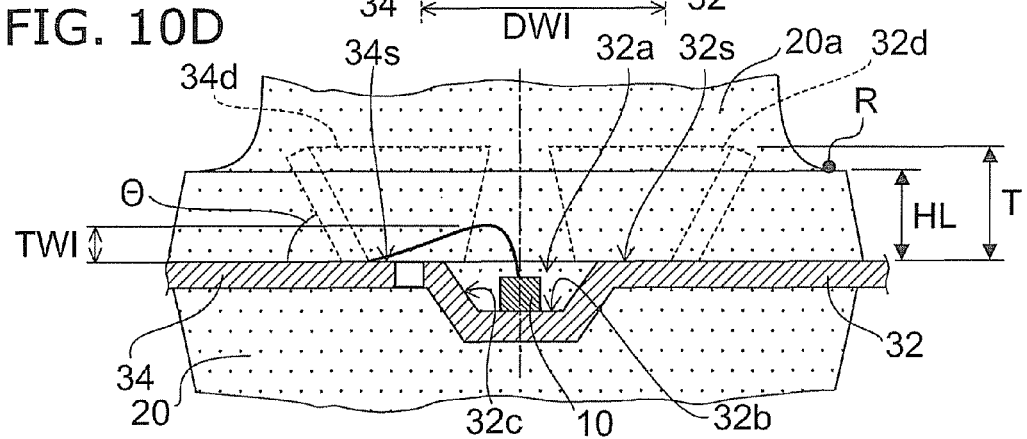

FIG. 10A is a schematic plan view of the lead frame, FIG. 10B is a schematic plan view of the lead frame after bending, FIG. 10C is a schematic cross-sectional view of the light emitting device, and FIG. 10D is a partial schematic cross-sectional view of a light emitting device having a bent portion according to a variation.

In FIG. 10A, the lead frame can be illustratively made of a copper-based alloy material having a thickness of 0.25 mm. The lead frame is punched out by press working and its surface is covered with a plating layer. The cup-shaped recess 32a is formed by depress working. A bottom surface 32b of the cup-shaped recess 32a has a diameter of 650 μm. And fan-shaped regions 32p, 34p, or sectors of a circle having a diameter D of 2.8 mm, are bent to the side (light extraction side) opposite to the bottom surface 32b of the recess 32a to form bent portions 32d, 34d as shown in FIG. 10B. If the surface 32s of the first lead 32 and the surface 34s of the second lead 34 are coplanar, it becomes easy to hold a mold so as to fix a vicinity of the recess 32a surely in bending step. Here, for instance, the bending angle Θ can be in the range from 45 to 70 degrees, and the height T of the bent portions 32d, 34d can be in the range from 0.6 to 1 mm. Subsequently, the light emitting element 10 is bonded to the bottom surface 32b and subjected to wire bonding. Then, a molded body 20 is formed from translucent resin by injection molding, as shown in the cross-sectional view of FIG. 10C. The height of the lens portion 20a is set to be larger than the height T of the top of the bent portions 32d, 34d. The diameter DLN of the lens portion 20a is larger than the diameter DWI of the bent portions 32d, 34d as viewed from above. Furthermore, the shape of the lens portion 20a may be concave, convex, Fresnel lens and so on.

Here, the surface of the lead frame can be coated with metal by plating or the like to increase reflectance. Thus, emitted light can be reflected upward (g1) by a sidewall 32c of the recess 32a. The light which is not directly emitted upward and may otherwise leak laterally without being reflected by the sidewall 32c of the recess 32a, can be reflected upward (g2) by the bent portions 32d, 34d. Naturally, the light g1 directly emitted upward is dominant.

FIG. 10D is a first variation of the bent portions, in which the top of the bent portion is penetrated into the lens portion 20a. More specifically, the height T of the top of the bent portion 32d, 34d measured from the lead surface is larger than the height HL of the bottom (point R) of the ridge line of the lens portion 20a measured from the lead surface. This allows the lens portion 20a to converge light more efficiently. Furthermore, if the bonding wire height TWI is smaller than the height T of the bent portions 32d, 34d, it facilitates avoiding bonding wire distortion by molded resin, and bonding wire distortion and disconnection in assembling.

Figure 11:
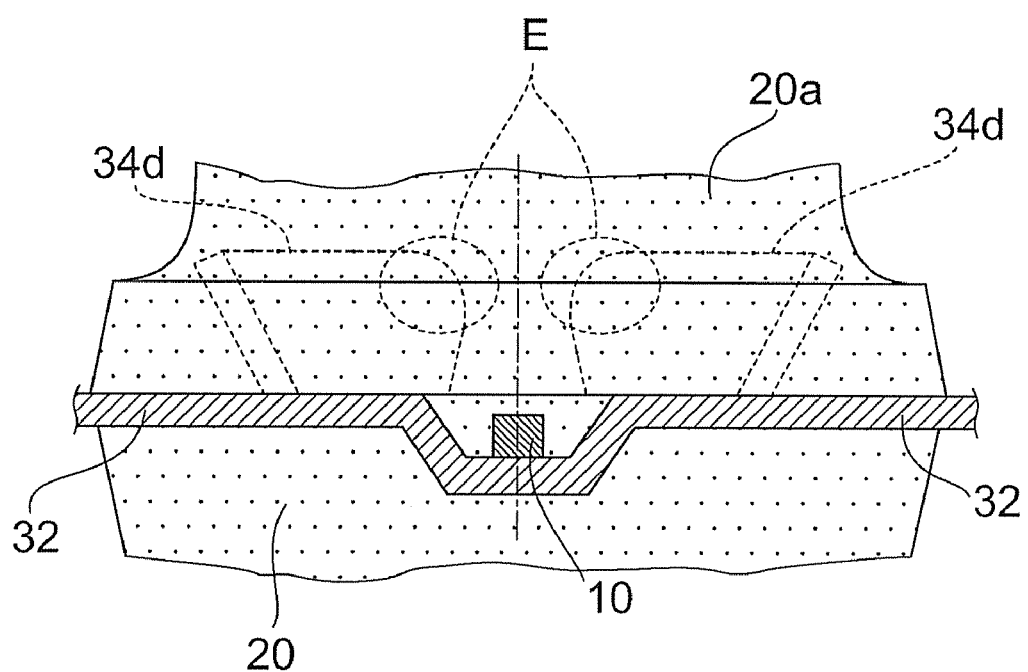
FIG. 11 is a schematic perspective view illustrating a variation of the bent portion.

FIG. 11 is a schematic cross-sectional view illustrating a second variation of the bent portions.

This figure shows a cross section orthogonal to the cross section of FIG. 10D, viewing the direction of the second lead 34 from the first lead 32. The corner of the bent portion 34d is provided with roundness E. When the light emitting element 10 is wire-bonded to the end portion of the second lead 34, the wire can avoid a break and the like even if it is brought into contact with that corner in the narrow gap between the two bent portions 34d of the second lead 34.

TABLE 1 summarizes the light distribution characteristics of the light emitting device according to this embodiment.

TABLE 1

| | | | Light distribution characteristics | | |
| --- | --- | --- | --- | --- | --- |
| D(mm) | Θ(deg) | T(mm) | Half angle at half maximum (deg) | Full angle at half maximum (deg) | Light flux utilization ratio (%) |
| 2.5 | 45 | 0.723 | 19.3 | 38.5 | 79.7 |
| | 60 | 0.885 | 18.9 | 37.8 | 81.5 |
| | 70 | 0.961 | 18.4 | 36.8 | 79.3 |
| 2.8 | 45 | 0.723 | 19.6 | 39.3 | 79.0 |
| | 60 | 0.885 | 18.8 | 37.7 | 81.0 |
| | 70 | 0.961 | 18.7 | 37.4 | 80.8 |

The table lists the half angle at half maximum (degree), the full angle at half maximum (degree), and the light flux utilization ratio (%) with reference to the light flux at an angle of 90 degrees, for various values of the diameter D (mm) of the fan-shaped regions 32p, 34p punched out by press working, the bending angle Θ (degree), and the height T (mm) of the bent portions 32d, 34d. Clearly, in either case where the diameter D is 2.5 or 2.8 mm, when the angle Θ of the bent portions 32d, 34d is around 60 degrees, the light flux utilization ratio is maximized and can be set to 81% or more.

Figure 12A:
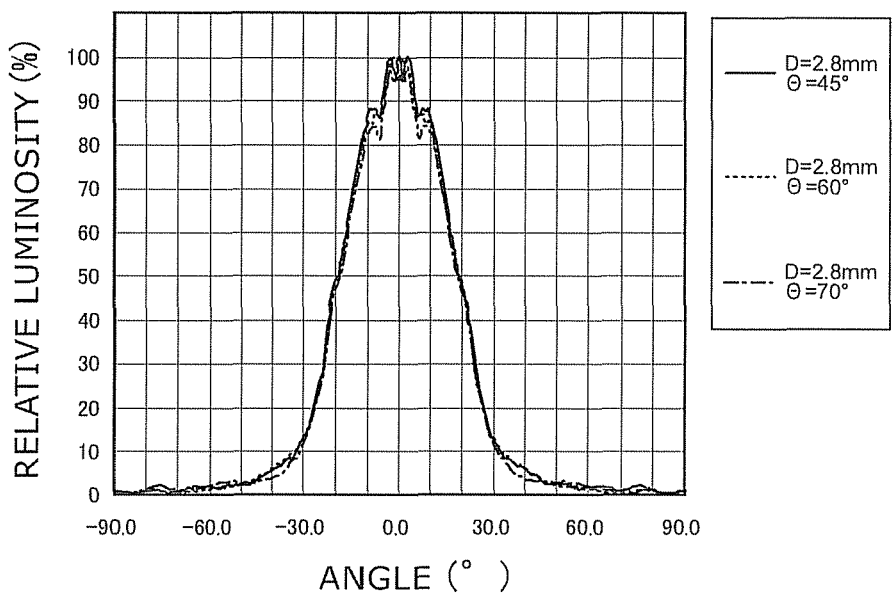
FIGS. 12A and 12B are graphs illustrating the light distribution characteristics.
Figure 12B:
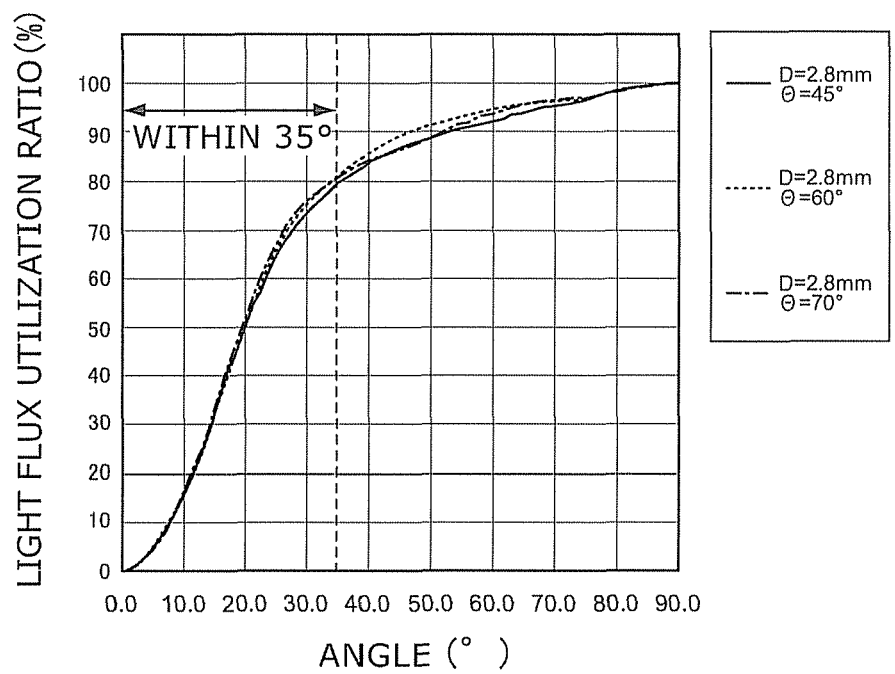

FIG. 12A is a graph illustrating the light distribution characteristics for a diameter D of 2.8 mm, and FIG. 12B is a graph showing the angle dependence of light flux utilization ratio.

In FIG. 12A, the vertical axis represents relative luminosity (%), and the horizontal axis represents angle (degree). With the variation of bending angle Θ from 45 to 70 degrees, the full angle at half maximum is narrowed from 39.3 to 37.4 degrees. In FIG. 12B, the vertical axis represents light flux utilization ratio (%), and the horizontal axis represents angle (degree). In the case where the effective illumination region is defined as within 35 degrees from the optical axis center, the light flux utilization ratio can be set to 80% or more for Θ at 60 and 70 degrees.

Figure 13A:
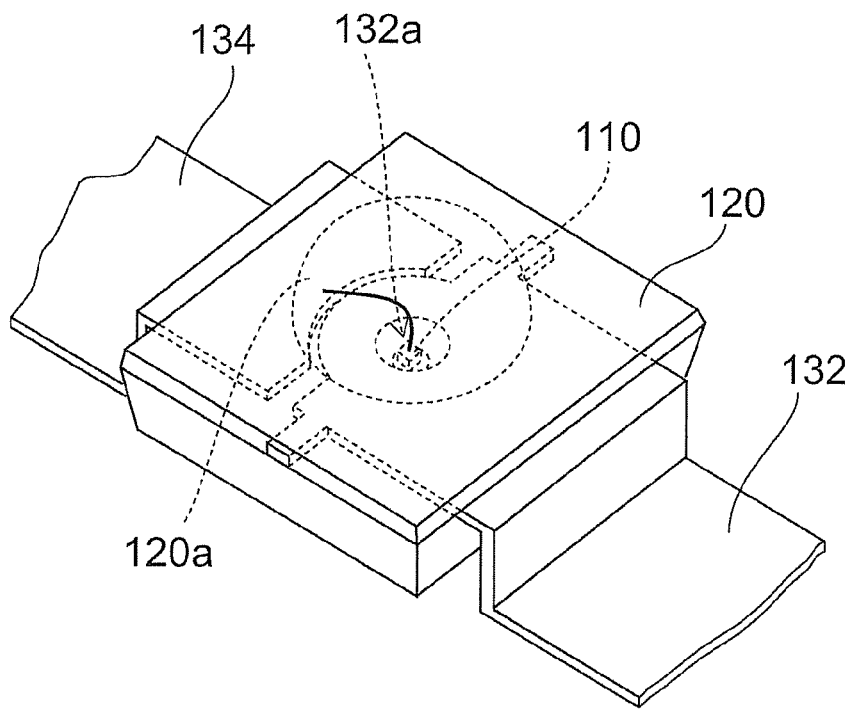
FIGS. 13A and 13B are views illustrating a comparative example.
Figure 13B:
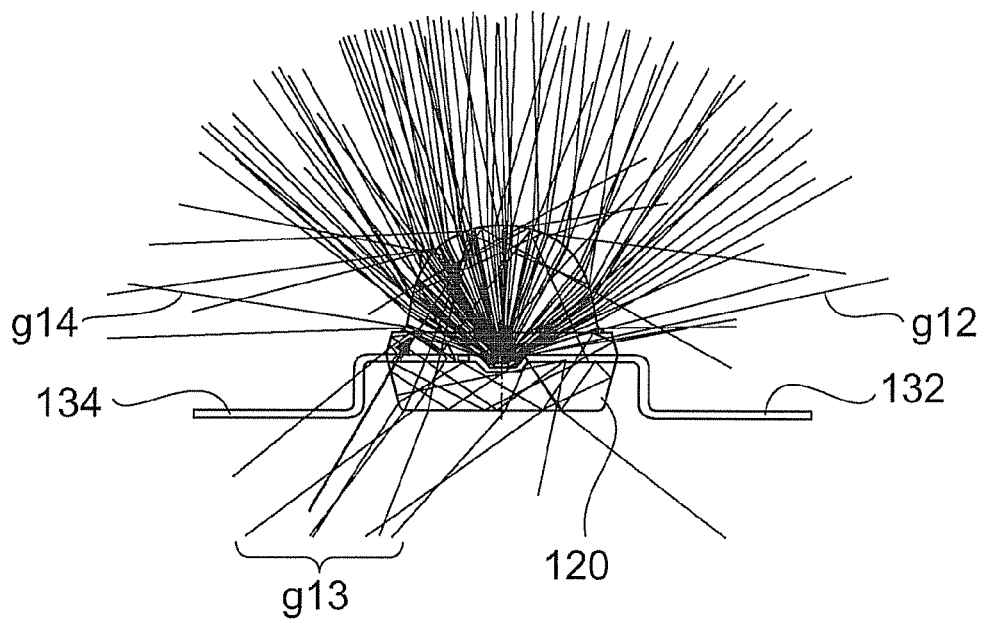

FIG. 13A is a schematic perspective view of a light emitting device according to a comparative example, and FIG. 13B is a ray tracing diagram by simulation. In FIG. 13A, the first lead 132 and the second lead 134 have no bent portion, and a sidewall of a recess 132a serving as a reflecting surface is spaced from a lens portion 120a. This results in light leaking laterally (g12, g14) and toward the backside (g13) as shown in FIG. 13B, thereby decreasing the brightness. For instance, in the case where the chip size of the light emitting element 110 is 290 μm square, in the effective illumination region within 35 degrees from the optical axis center, the half angle at half maximum is 20.6 degrees, the full angle at half maximum is 41.2 degrees, and the light flux utilization ratio is 77.6%. That is, the light flux utilization ratio is lower than that in this embodiment.

In the comparative example, the leakage of light can be reduced by making the recess 132a deeper. However, this tends to cause short circuit due to the under loop of the bonding wire. Furthermore, the stress between the resin molded body 120 and the first and second leads 132, 134 may produce a gap between the light emitting element 110 and the molded body 120, or may cause the light emitting element 110 to peel off. Although a through hole serving as an anchor hole can be provided near the recess 132a to facilitate reducing the stress, a means for reducing light leakage is separately required.

In contrast, in the sixth embodiment, even light emitted obliquely laterally without being reflected by the sidewall 32c of the recess 32a can be reflected upward by the bent portions 32d, 34d. That is, light leaking laterally can be reduced. Here, more preferably, the depth of the recess 32a can be illustratively in the range from 1 to 1.5 times the height of the light emitting element 10. This can reduce stress applied to the light emitting element 10 and the like, hence increasing the reliability. Simultaneously, the reflecting structure formed by the sidewall 32c of the recess 32a and the bent portions 32d, 34d can increase the light flux utilization efficiency.

Figure 14A:
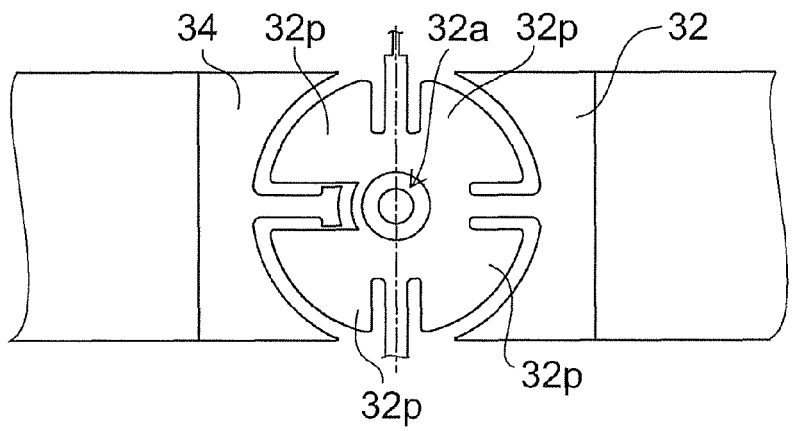
FIGS. 14A to 14C are schematic views of a light emitting device according to a seventh embodiment.
Figure 14B:
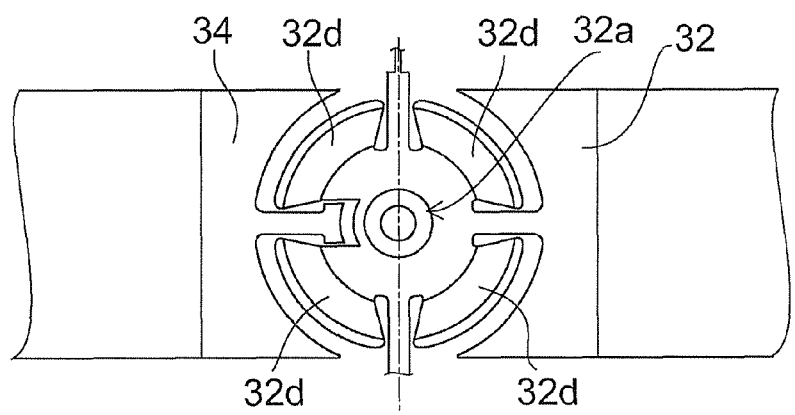
Figure 14C:
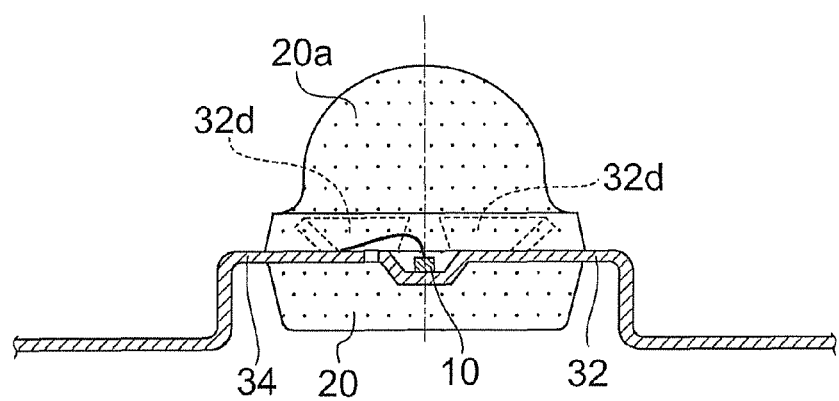

FIG. 14A is a schematic plan view of the lead frame of a light emitting device according to a seventh embodiment, FIG. 14B is a schematic plan view of the lead frame after bending, and FIG. 14C is a schematic cross-sectional view of the light emitting device.

In FIG. 14A, four fan-shaped regions 32p, or sectors of a circle having a diameter of 2.8 mm, are punched out in the lead frame by press working. Subsequently, as shown in FIG. 14B, the fan-shaped regions 32p are bent to the side (light extraction side) opposite to the bottom surface 32b of the recess 32a to form four bent portions 32d. Subsequently, the light emitting element 10 is bonded to the bottom surface 32b and subjected to wire bonding. Then, the molded body 20 is formed from translucent resin by injection molding, as shown in the cross-sectional view of FIG. 14C. Thus, the effect of reducing the leakage of emitted light and the anchoring effect can be enhanced also when the bent portions are provided only in one lead. Here, more preferably, the bent portions are provided on the side where the light emitting element 10 is bonded, because it facilitates reducing the leakage of light. The number of bent portions and the layout thereof are not limited to those in the sixth and seventh embodiment.

The first to seventh embodiment and the associated variations provide a light emitting device having higher adhesion strength at the interface between the lead and the molded body and between the light emitting element and the molded body while maintaining high optical output, brightness, and light flux. Such a high-brightness light emitting device can be used in such applications as various types of displays, traffic signals and other signs, and vehicle-mounted interior and exterior lamps. Here, its electrical and optical characteristics can be made stable against temperature variation in the mounting process and a severe operating environment, which facilitates achieving high reliability.

The embodiments of the invention have been described with reference to the drawings. However, the invention is not limited to these embodiments. Those skilled in the art can variously modify the shape, material, size, layout and the like of the light emitting element, lead, translucent resin, molded body and the like constituting the light emitting device, and such modifications are also encompassed within the scope of the invention unless they depart from the spirit of the invention.

The invention claimed is:

1. A light emitting device comprising:
a light emitting element;
a first lead including a recess in one end portion, the recess including a first bottom surface with the light emitting element bonded thereto, at least one of a through hole and a notch, and a light shielding portion capable of suppressing leakage of emitted light from the light emitting element from the one of the through hole and the notch; wherein the light shielding portion is a bent portion formed by bending a prescribed region of the first lead toward the light emitting element, and the one of the through hole and the notch is a spaced formed in the prescribed region;
a second lead opposed to the first lead; and
a molded body filling the one of the through hole and the notch, covering the light emitting element, embedding at least part of the first lead and at least part of the second lead, and made of a translucent resin.

2. The device according to claim 1, wherein
the recess further includes a sidewall where the prescribed region is provided, and
the bent portion, and the sidewall where the bent portion is not formed, can reflect the emitted light upward.

3. The device according to claim 1, further comprising:
a bonding wire connecting the light emitting element to the second lead,
the bonding wire not passing immediately above the bent portion.

4. The device according to claim 1, wherein the prescribed region is part of the first bottom surface.

5. The device according to claim 4, wherein
the recess further includes a sidewall, and
the bent portion and the sidewall can reflect the emitted light upward.

6. The device according to claim 1, wherein
the recess further includes a second bottom surface deeper than the first bottom surface,
the light shielding portion is a lower sidewall coupling the first bottom surface to the second bottom surface and being capable of shielding the emitted light, and
the through hole is provided in the lower sidewall.

7. A light emitting device comprising:
a light emitting element;
a first lead including a recess, and first and second bent portions bent to a light extraction side of the recess, the recess including a bottom surface with the light emitting element bonded thereto and a sidewall capable of partly reflecting emitted light from the light emitting element upward;
a second lead opposed to the first lead; wherein the first lead further includes a third and fourth bent portions bent to the light extraction side of the recess so that the emitted light can be partly reflected upward, and the molded body fills between each pair of the first to fourth bent portions and
a molded body filling between the first and second bent portions, covering the light emitting element, embedding at least part of the first lead and at least part of the second lead, and made of a translucent resin,
the first and second bent portion being capable of partly reflecting the emitted light upward.

8. The device according to claim 7, wherein the first to fourth bent portions are each fan-shaped.

9. The device according to claim 7, wherein the first to fourth bent portions are arranged at generally 90-degree spaces around the light emitting element as viewed from above.

10. The device according to claim 7, wherein
the second lead includes a third and fourth bent portions bent so that the emitted light can be partly reflected upward, and the molded body fills between each pair of the first to fourth bent portions.

11. The device according to claim 10, further comprising:
a bonding wire connecting the light emitting element to the second lead,
the bonding wire not passing immediately above the third and fourth bent portions.

12. The device according to claim 11, wherein corners of the third and fourth bent portions opposed to each other are each shaped like a convex curve.

13. The device according to claim 10, wherein the first to fourth bent portions are each fan-shaped.

14. The device according to claim 10, wherein the first to fourth bent portions are arranged at generally 90-degree spaces around the light emitting element as viewed from above.

15. The device according to claim 7, wherein
a lens surface is formed at a surface of the molded body on the light extraction side, and
height of the first and second bent portions measured from a surface of the first lead is larger than height of a bottom of the lens surface measured from the surface.

16. A light emitting device comprising:
a light emitting element;
a first lead with the light emitting element bonded thereto, the first lead including a first and second bent portions bent so that emitted light from the light emitting element can be reflected upward; wherein an end portion of the first bent portion and an end portion of the second bent portion have an overlapping region as viewed from the light emitting element
a second lead opposed to the first lead; and
a molded body filling between the first and second bent portions, covering the light emitting element, embedding at least part of the first lead and at least part of the second lead, and made of a translucent resin.

17. The device according to claim 16, wherein the first and second bent portions are shaped like a plane, or a curved surface having a cross section concave upward.

* * * * *